(12) United States Patent
Laneryd et al.

(10) Patent No.: US 11,419,241 B2
(45) Date of Patent: Aug. 16, 2022

(54) HEAT EXCHANGING ARRANGEMENT AND SUBSEA ELECTRONIC SYSTEM

(71) Applicant: ABB Schweiz AG, Baden (CH)

(72) Inventors: Tor Laneryd, Enköping (SE); Thomas Gradinger, Aarau Rohr (CH); Heinz Lendenmann, Västerås (SE); Thomas Wagner, Mägenwil (CH); Hui Huang, Stockholm (SE); Kim Missing, Vaasa (FI); Mika Norolampi, Tervajoki (FI)

(73) Assignee: ABB Schweiz AG, Baden (CH)

( * ) Notice: Subject to any disclaimer, the term of this patent is extended or adjusted under 35 U.S.C. 154(b) by 115 days.

(21) Appl. No.: 16/604,476

(22) PCT Filed: Apr. 4, 2018

(86) PCT No.: PCT/EP2018/058603
§ 371 (c)(1),
(2) Date: Oct. 10, 2019

(87) PCT Pub. No.: WO2018/189009
PCT Pub. Date: Oct. 18, 2018

(65) Prior Publication Data
US 2020/0383239 A1 Dec. 3, 2020

(30) Foreign Application Priority Data

Apr. 12, 2017 (EP) ..................... 17166172

(51) Int. Cl.
*H05K 7/20* (2006.01)
*F28F 1/40* (2006.01)
*H01L 23/473* (2006.01)

(52) U.S. Cl.
CPC ........... *H05K 7/20263* (2013.01); *F28F 1/40* (2013.01); *H01L 23/473* (2013.01)

(58) Field of Classification Search
CPC .. E21B 36/001; E21B 36/005; F28D 15/0233; F28D 15/0275; F28D 1/022;
(Continued)

(56) References Cited

U.S. PATENT DOCUMENTS 6,142,215 A * 11/2000 Paulsen ................. F28D 1/0213
165/128
2004/0244948 A1 * 12/2004 Luo ..................... F28D 15/0233
165/80.3

(Continued)

FOREIGN PATENT DOCUMENTS

CN 102297614 A 12/2011
CN 102829646 A 12/2012
(Continued)

OTHER PUBLICATIONS

Extended European Search Report Applicaiton No. 17 166 172 Completed: Oct. 27, 2017; dated Nov. 7, 2017 6 pages.
(Continued)

*Primary Examiner* — Michael A Matey
(74) *Attorney, Agent, or Firm* — Whitmyer IP Group LLC (57) ABSTRACT

A heat exchanging arrangement for a subsea electronic system, the heat exchanging arrangement including: at least one pipe having an external surface; and at least one heat exchanging element arranged inside the at least one pipe and defining at least one internal passage for conducting a dielectric fluid through the at least one pipe; wherein the at least one heat exchanging element is arranged to press laterally outwards against an internal surface of the at least one pipe to establish a heat transfer bond between the at least one heat exchanging element and the at least one pipe. A subsea electronic system including the heat exchanging arrangement is also provided.

15 Claims, 9 Drawing Sheets

(58) Field of Classification Search
CPC ..... F28D 2021/0028; F28D 2021/0029; F28D 21/0017; F28D 9/005; F28D 9/0093; F24T 10/13; F28F 9/26; F28F 13/00; F28F 21/062; F28F 9/22; F28F 1/40; H05K 7/20263; H01L 23/473

See application file for complete search history.

(56) References Cited

U.S. PATENT DOCUMENTS

| | | | | |
|---|---|---|---|---|
| 2005/0061486 A1* | 3/2005 | Yang | ................ | F28D 15/0208 |
| | | | | 165/104.33 |
| 2008/0164966 A1* | 7/2008 | Findeisen | ............... | F03D 13/10 |
| | | | | 336/57 |
| 2008/0223032 A1* | 9/2008 | Sumrall | .................... | F02C 1/05 |
| | | | | 60/531 |
| 2010/0089584 A1* | 4/2010 | Burns | ....................... | H01C 3/00 |
| | | | | 166/302 |
| 2010/0270003 A1* | 10/2010 | Sarria | ..................... | C02F 1/048 |
| | | | | 165/45 |
| 2012/0175077 A1* | 7/2012 | Lehmann | ................ | E21B 19/24 |
| | | | | 165/45 |
| 2012/0298343 A1 | 11/2012 | Irmann-Jacobsen et al. | | |
| 2013/0292094 A1 | 11/2013 | Omori et al. | | |
| 2014/0105686 A1* | 4/2014 | Southworth | ......... | B65D 90/046 |
| | | | | 405/107 |
| 2014/0332191 A1* | 11/2014 | Jarmon | ................ | F28D 7/0008 |
| | | | | 165/154 |
| 2015/0107244 A1* | 4/2015 | Lakic | ........................ | E02B 1/00 |
| | | | | 60/641.2 |
| 2015/0122453 A1* | 5/2015 | Colwell | ................ | F24T 10/20 |
| | | | | 165/45 |
| 2015/0292824 A1* | 10/2015 | Andersen | ................ | F28F 9/002 |
| | | | | 134/8 |
| 2016/0216045 A1* | 7/2016 | Chan | ....................... | F28D 7/106 |
| 2016/0381841 A1 | 12/2016 | Peterson et al. | | |
| 2017/0089187 A1* | 3/2017 | Hytken | ................. | E21B 36/005 |
| 2017/0112021 A1* | 4/2017 | Gradinger | .......... | H05K 7/20927 |
| 2017/0306706 A1* | 10/2017 | Bjoerneklett | ........... | E21B 17/01 |

FOREIGN PATENT DOCUMENTS

| | | |
|---|---|---|
| CN | 106165558 A | 11/2016 |
| DE | 8804742 U1 | 6/1988 |
| EP | 2487326 A1 | 8/2012 |
| EP | 2487327 A1 | 8/2012 |
| EP | 2825008 A1 | 1/2015 |
| EP | 2928275 A1 | 10/2015 |
| EP | 3051243 A1 | 8/2016 |
| JP | S5847994 A | 3/1983 |
| JP | S58168487 A | 10/1983 |
| JP | 2001269104 A | 10/2001 |
| SE | 1400472 A1 | 10/2014 |
| WO | 2008004885 A1 | 1/2008 |
| WO | 2014071985 A1 | 5/2014 |
| WO | 2015003936 A1 | 1/2015 |
| WO | 2015150007 A1 | 10/2015 |

OTHER PUBLICATIONS

International Preliminary Report on Patentability Application No. PCT/EP2018/058603 dated Oct. 15, 2019 7 pages.
Australian Examination Report No. 1 Application No. 2018251757 dated Mar. 23, 2020 3 pages.
International Search Report and Written Opinion of the International Searching Authority Application No. PCT/EP2018/058603 Completed: Jun. 12, 2018; dated Jun. 22, 2018 10 pages.
Chinese Office Action Translation & Search Report Application No. 2018800145717 Completed: Jan. 17, 2020 16 pages.
Chinese Office Action and Translation Application No. 2018800145717 Issued: May 21, 2020 9 pages.
Chinese Board Opinions; Application No. 201880014571.7; Issued: Mar. 26, 2021; 25 Pages.

* cited by examiner

HEAT EXCHANGING ARRANGEMENT AND SUBSEA ELECTRONIC SYSTEM

TECHNICAL FIELD

The present disclosure generally relates to heat exchanging arrangements for subsea electronic systems. In particular, a heat exchanging arrangement comprising at least one pipe and at least one heat exchanging element arranged inside the pipe, and a subsea electronic system comprising the heat exchanging arrangement, are provided.

BACKGROUND

Equipment for subsea electrification including static induction devices, e.g. transformers, and power electronic equipment, e.g. power converters, variable speed drives or HVDC (high-voltage direct current) valves, can advantageously be submerged in a tank with a dielectric fluid. The dielectric fluid acts as electric insulation and cooling medium and can be used with one or more pressure compensators to achieve an internal pressure close to or equal to the external pressure of the ambient seawater.

Due to the relatively low cooling performance of natural convection cooling, a large surface area is required to keep a sufficiently low temperature for reliable long term operation of the subsea electronic system. Generally, the tank surface alone is not sufficient for the cooling and the cooling capacity can be augmented by a seawater heat exchanger.

US 2016381841 A1 discloses a submersible pressure shell including walls that define an interior space in which heat generating equipment is received. An external heat exchanger is located outside of the shell and arranged for fluid communication with an internal heat exchanger. A prime mover is provided that is in fluid communication with the internal heat exchanger and the external heat exchanger, and the prime mover is operable to circulate a flow of coolant through the internal heat exchanger and the external heat exchanger. The external heat exchanger comprises plenums in fluid communication with a plurality of tubes. The tubes are exposed to the external environment and heat from the flowing coolant is transferred to the tubes and then to the external environment.

EP 2487327 A1 discloses a subsea electronic system comprising a watertight enclosure and a heat generating electronic component arranged in the enclosure. The enclosure is filled with a dielectric fluid in which the electronic component is submerged and a heat sink is arranged on a wall of the enclosure and thermally coupled thereto. The heat sink may be made of aluminum and comprises a plurality of heat dissipating elements, such as fins or pins, extending into the dielectric fluid.

SUMMARY

Prior art oil immersed power devices, such as power transformers, on land typically use plate heat exchangers having a larger surface area towards the air and an equivalent or smaller surface area towards the oil. This is suitable for systems on land because the heat transfer coefficient towards the air is limiting the total heat transfer. However, seawater has much better thermal properties than air so for a subsea system the oil heat transfer coefficient is limiting the total heat transfer.

In the submersible pressure shell of US 2016381841 A1 comprising a tube bundle heat exchanger, the coolant will flow inside thick tubes. Thereby, the oil wetted surface area is comparatively small compared to the exterior surface towards the ambient seawater. The coolant surface within the tubes becomes a limiting factor in the thermal chain. Consequently, the required size of the heat exchanger becomes large. This could be alleviated by providing steel tubes of a larger diameter but in this case there would be a large volume of coolant that does not participate in the heat transfer and only adds extra weight and volume to the submersible pressure shell.

Moreover, if each tube in US 2016381841 A1 is welded individually the manufacturing process is tedious and the risk of leakages is increased. With this construction, it is also difficult to access all exterior surfaces for cleaning, e.g. from marine growth.

There are also prior art solutions where a subsea heat exchanger is made entirely of aluminum. However, such heat exchangers are problematic due to galvanic corrosion when the enclosure of the subsea system is made of steel, which is typically the case.

One object of the present disclosure is to provide a heat exchanging arrangement having a more efficient heat transfer performance.

A further object of the present disclosure is to provide a heat exchanging arrangement having a compact design, cheap design and/or a reduced weight.

A still further object of the present disclosure is to provide a heat exchanging arrangement that provides a good thermal contact between a heat exchanging element and a pipe.

A still further object of the present disclosure is to provide a heat exchanging arrangement having a reliable operation.

A still further object of the present disclosure is to provide a heat exchanging arrangement having a simple design, simple assembly and/or simple maintenance.

A still further object of the present disclosure is to provide a subsea electronic system comprising a heat exchanging arrangement solving one or more of the foregoing objects.

According to one aspect, there is provided a heat exchanging arrangement for a subsea electronic system, the heat exchanging arrangement comprising at least one pipe having an external surface; and at least one heat exchanging element arranged inside the at least one pipe and defining at least one internal passage for conducting a dielectric fluid through the at least one pipe; wherein the at least one heat exchanging element is arranged to press laterally outwards against an internal surface of the at least one pipe to establish a heat transfer bond between the at least one heat exchanging element and the at least one pipe.

In comparison with prior art pipe bundle solutions, the heat exchanging arrangement according to this aspect enables a reduction of the number of pipes for a given heat transfer performance. Consequently, the number of welds, e.g. between the pipes and an enclosure of the subsea electronic system, can be reduced and the reliability of the subsea electronic system can be improved. The reduction of the number of pipes also enables a facilitated cleaning of the pipes.

Throughout the present disclosure, the heat exchanging arrangement for a subsea electronic system may alternatively be referred to as a subsea heat exchanger and/or the at least one heat exchanging element may alternatively be referred to as a heat sink. The external surface of the at least one pipe may be arranged to be in contact with ambient seawater.

Various different dielectric fluids may be used in the subsea electronic system according to the present disclosure. Examples of dielectric fluid include mineral oil and natural esters. Throughout the present disclosure, the dielectric fluid may be constituted by a dielectric liquid.

The at least one pipe may be circular. Also the at least one heat exchanging element may form a circular outer surface to be pressed laterally outwards against the internal surface of the pipe. Alternatively, the at least one pipe may have a smooth cross section, i.e. without sharp corners. These solutions ensure an even pressure distribution over the circumference of the internal surface of the pipe. In case the at least one pipe is circular, the lateral direction according to the present disclosure may correspond to the radial direction. In any case, a lateral direction of the pipe as used herein is a direction substantially perpendicular to a longitudinal direction of the pipe.

According to one variant, each of the at least one internal passage within a pipe may have a maximum lateral extension of 0.2 mm. In some implementations, the heat transfer performance is detrimentally affected when the lateral extension of the internal passage exceeds 0.2 mm. This is difficult to avoid for a flat aluminum heat sink on a flat steel tank wall according to some prior art due to manufacturing tolerances and bending forces, such as in EP 2487327 A1.

The at least one heat exchanging element and the at least one pipe may be shrink fitted. The shrink fitting process ensures a good thermal contact between the at least one heat exchanging element and the at least one pipe. One way to accomplish this shrink fit is to heat the pipe and cool the at least one heat exchanging element associated with the pipe before inserting the one or more heat exchanging elements into the pipe. Due to the shrink fit, the at least one heat exchanging element can be arranged to press laterally outwards against the internal surface of the associated pipe. The shrink fitting process may be used to press a single heat exchanging element or several heat exchanging elements aligned along the longitudinal axis of the pipe against the internal surface of the pipe.

The heat exchanging arrangement may further comprise at least one expansion tool substantially concentrically arranged inside the at least one pipe for pressing the at least one heat exchanging element laterally outwards against the internal surface of the at least one pipe. This variant enables the at least one heat exchanging element to be secured tightly against the internal surface of the associated pipe and ensures a good thermal contact between the at least one heat exchanging element and the at least one pipe.

This variant of the heat exchanging arrangement can also provide a good fit of the one or more heat exchanging elements within the associated pipe when the pipe and/or the heat exchanging elements have wider tolerances and machining of the pipes and/or the heat exchanging elements can be avoided. Thereby, additional costs and time associated with the provision of tight tolerances between the heat exchanging elements and the pipes can be avoided. The heat exchanging arrangement comprising at least one expansion tool according to the present disclosure also enables the use of simpler heat exchanging elements.

In order to prepare the heat exchanging arrangement, the at least one heat exchanging element may be inserted into the pipe. The expansion tool may then be inserted and activated (e.g. by screwing to press expanding elements of the expansion tool laterally outwards) to press the at least one heat exchanging element laterally outwards against the internal surface of the associated pipe. The expansion tool may be used to press a single heat exchanging element or several heat exchanging elements aligned along the longitudinal axis of the pipe against the internal surface of the pipe.

Alternative solutions for arranging the at least one heat exchanging element to press laterally outwards against the internal surface of the at least one pipe are conceivable. For example, a mechanical spring, such as a garter spring, may be used to further increase the laterally outwardly directed force of the one or more heat exchanging elements against the internal surface of the associated pipe to increase the force and improve the thermal contact.

Various alternative cross sectional profiles of the at least one heat exchanging element are conceivable. According to one variant, the at least one heat exchanging element comprises fins protruding substantially laterally inwards towards a longitudinal axis of the at least one pipe. The fins may be substantially evenly distributed along the circumference of the heat exchanging element, e.g. along 360° in case only one heat exchanging element is provided at one level of the pipe. The fins increase the heat transfer area on the dielectric fluid side to balance the better heat transfer performance of seawater in comparison with air.

The fins may have a substantially uniform thickness along an axis parallel with the longitudinal axis of the associated pipe. The heat exchanging element may comprise a cylinder from which the fins extend. The cylinder and the fins may be integrally formed.

The fins may have an alternating lateral extension towards the longitudinal axis of the at least one pipe. This variant can provide an optimal balance between the width of the internal passage and the width of the fins.

The at least one heat exchanging element may comprise at least two heat exchanging elements arranged inside the at least one pipe at substantially the same position along a longitudinal axis of the at least one pipe. For example, the at least one heat exchanging element may comprise two, three, four, six or eight heat exchanging elements arranged inside the at least one pipe at substantially the same position along the longitudinal axis of the at least one pipe. Each of these heat exchanging elements may have an identic shape and size, e.g. each heat exchanging element may have a general appearance of a circular sector having an angular extension of 90° in case four heat exchanging elements are provided.

The at least one heat exchanging element and the at least one pipe may be independent components. Thereby, the at least one heat exchanging element may be inserted into an associated pipe and be forced laterally outwards towards the internal surface of the pipe, e.g. by shrink fitting, by an expansion tool and/or by various types of springs.

The at least one heat exchanging element may be extruded. The extrusion process enables manufacture of the at least one heat exchanging element with a more complex and optimized heat transfer surface.

The at least one heat exchanging element may be made of a material with high thermal conductivity, such as aluminum. A high thermal conductivity may be at least 100 watts per meter per Kelvin (W/(m*K)) at atmospheric pressure and around 293 K.

The at least one pipe may be made of a material resistant to seawater corrosion, such as stainless steel. Alternatively, or in addition, the pipe may be made of a material resistant to corrosion in electric contact with the material of the enclosure of the subsea electronic system. According to one variant, the at least one pipe and the enclosure are made of stainless steel. In this case, there will be no galvanic corrosion between these parts.

According to one variant, the at least one heat exchanging element comprises at least two heat exchanging elements having longitudinal recesses such that a longitudinal recess of one heat exchanging element and a longitudinal recess of another heat exchanging element together define one of the at least one internal passage when the heat exchanging elements are mated.

The heat exchanging arrangement may further comprise a thermally insulated tube arranged laterally inside the at least one heat exchanging element; wherein the at least one pipe comprises a closed end; wherein the thermally insulated tube is arranged to conduct the dielectric fluid towards the closed end of the at least one pipe and wherein the at least one internal passage is arranged to conduct the dielectric fluid away from the closed end of the at least one pipe, e.g. towards the interior of an enclosure of the subsea electronic system.

According to a further aspect, there is provided a subsea electronic system comprising a watertight enclosure having at least one wall section; at least one electronic component arranged inside the enclosure; and a heat exchanging arrangement according to the present disclosure; wherein the at least one pipe of the heat exchanging arrangement forms a part of a cooling circuit passing by the at least one electronic component. The enclosure may be constituted by a tank.

The enclosure and the heat exchanging arrangement of the subsea electronic system form a cooling system. The cooling system may be passive, i.e. the dielectric fluid may be circulated in the cooling circuit by natural convection only. This improves the reliability of the subsea electronic system. Alternatively, one or more pumps may additionally be used to assist the circulation of the dielectric fluid in the cooling circuit.

The at least one wall section may have a wave formed profile comprising peaks and valleys and the at least one pipe may be at least partly accommodated within a valley. By fitting the at least one pipe between two peaks in this manner, the footprint of the subsea electronic system can be reduced.

According to one variant, one of the at least one wall section is a substantially vertically oriented wall section and the heat exchanging arrangement is connected to the wall section. One of the at least one electronic component may be constituted by a power converter.

According to one variant, the enclosure comprises an upper enclosure part and a lower enclosure part jointly defining a continuous enclosure volume for a dielectric fluid; wherein the enclosure volume comprises an upper cooling circuit and a lower cooling circuit, vertically below the upper cooling circuit; and wherein the at least one pipe of the heat exchanging arrangement forms a part of the upper cooling circuit passing by the at least one electronic component. In this case, one or more wall sections of the upper enclosure part may be provided with the wave formed profile. The wall sections of the lower enclosure part may be substantially flat. When the at least one electronic component is in use, the dielectric fluid may circulate by natural convection.

As used herein, substantially parallel, perpendicular, horizontal, vertical, concentric and lateral relationships include perfectly parallel, perpendicular, horizontal, vertical, concentric and lateral relationships, respectively, as well as deviations therefrom with up to 5%, such as up to 2%.

BRIEF DESCRIPTION OF THE DRAWINGS

Further details, advantages and aspects of the present disclosure will become apparent from the following embodiments taken in conjunction with the drawings, wherein.

DETAILED DESCRIPTION

In the following, a heat exchanging arrangement comprising at least one pipe and at least one heat exchanging element arranged inside the pipe, and a subsea electronic system comprising the heat exchanging arrangement, will be described. The same reference numerals will be used to denote the same or similar structural features.

Figure 1:
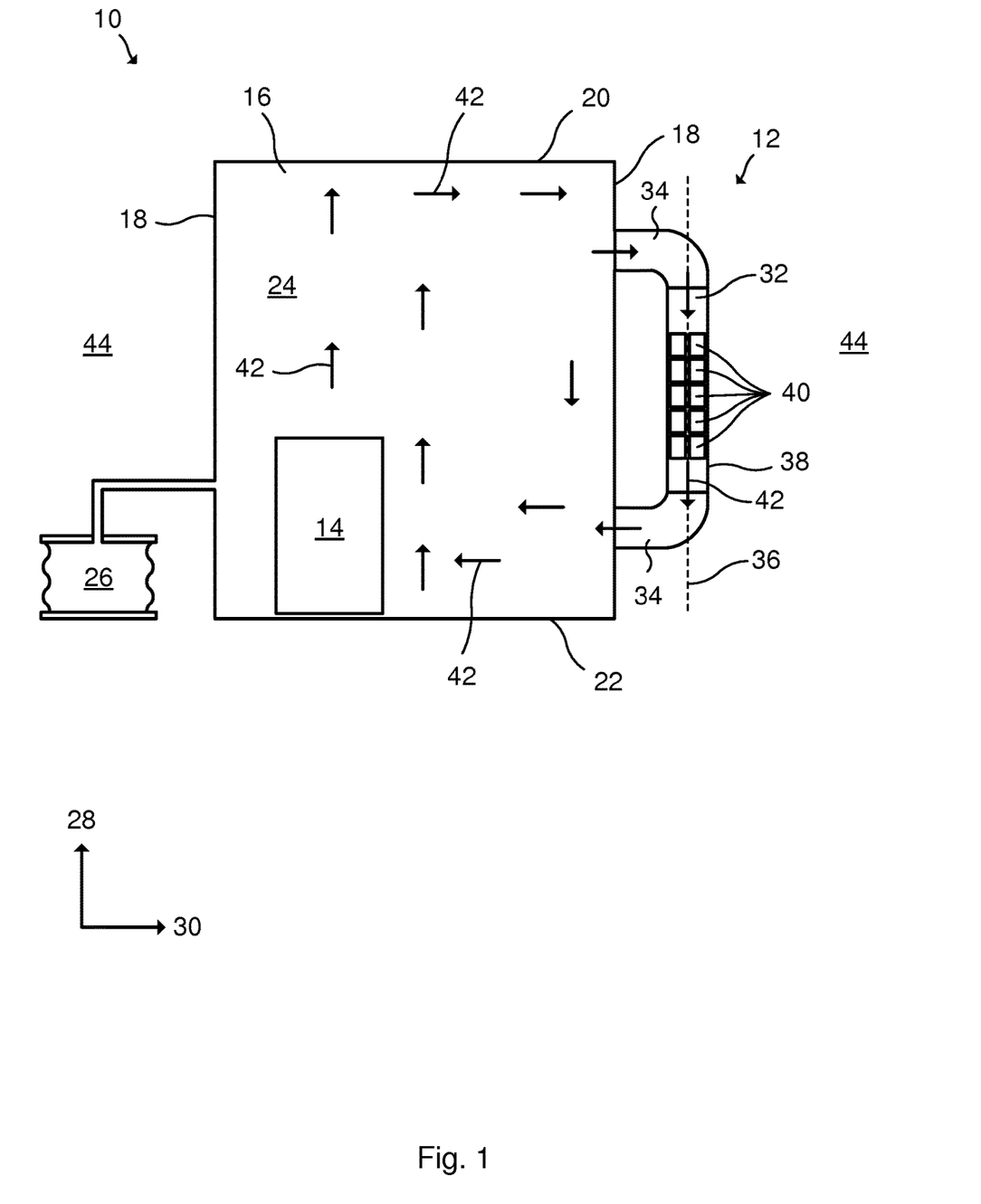
FIG. 1: schematically represents a side view of an example of a subsea electronic system comprising a heat exchanging arrangement.

FIG. 1 schematically represents a side view of an example of a subsea electronic system 10 comprising a heat exchanging arrangement 12 and an electronic component 14. The subsea electronic system 10 comprises an enclosure 16 having four vertically oriented side wall sections 18, a horizontally oriented top wall section 20 and a bottom 22. The electronic component 14 is arranged within the enclosure 16 which is filled, at least partially, with a dielectric fluid 24. Several electronic components 14, and other components, may also be arranged within the enclosure 16.

The subsea electronic system 10 of this example further comprises a pressure compensator 26 to compensate for volumetric changes of the dielectric fluid 24. The pressure compensator 26 is illustrated as a bellows pressure compensator but may be of alternative types. FIG. 1 also shows a vertical direction 28 and a horizontal direction 30.

The heat exchanging arrangement 12 of this example comprises only one pipe 32 but may alternatively comprise several pipes 32. The pipe 32 is welded to the enclosure 16 via connection pipes 34 but may alternatively be welded directly to the enclosure 16. The pipe 32 is substantially straight and has a longitudinal axis 36 oriented substantially vertically. The pipe 32 further comprises an external surface 38. The external surface 38 of the pipe 32 is in contact with the ambient seawater 44.

The heat exchanging arrangement 12 comprises the pipe 32 and a plurality of heat exchanging elements 40 arranged within the pipe 32. In FIG. 1, the heat exchanging arrangement 12 is connected to one of the vertically oriented side wall sections 18 of the enclosure 16.

When the electronic component 14 is in operation, the dielectric fluid 24 will be heated up by power losses from the electronic component 14 and experience a buoyancy force upwards, while hot dielectric fluid 24 in vicinity of the wall sections 18, 20 of the enclosure 16 and in the pipe 32 will be cooled down and experience a buoyancy force downwards. This will create a circulating flow of the dielectric fluid 24 in a cooling circuit 42 where heat carried by the dielectric fluid 24 is transferred to the ambient seawater 44. The pipe 32 of the heat exchanging arrangement 12 forms a part of the cooling circuit 42 passing by the electronic component 14. Thus, the dielectric fluid 24 flows uniformly (i.e. in one direction) downwards through the pipe 32.

In FIG. 1, the circulating flow of dielectric fluid 24 is driven by natural convection. However, the subsea electronic system 10 may be equipped with one or more pumps to assist the circulation of dielectric fluid 24.

The heat exchanging elements 40 may be made of various heat conducting materials but are in FIG. 1 made of aluminum. In the example of FIG. 1, the heat exchanging arrangement 12 is illustrated as comprising four heat exchanging elements 40. Both the pipe 32 and the enclosure 16 may be made of stainless steel.

The heat exchanging elements 40 define several internal passages (not denoted) for conducting the dielectric fluid 24 through the pipe 32. The heat exchanging elements 40 are arranged to press laterally outwards (i.e. substantially horizontally out from the longitudinal axis 36 of the pipe 32) against an interior surface (not denoted) of the pipe 32. Thereby, a heat transfer bond is established between the heat exchanging elements 40 and the pipe 32. Heat from the dielectric fluid 24 within the pipe 32 is transferred by the heat exchanging elements 40 to the pipe 32 and to the ambient seawater 44 surrounding the pipe 32. In the example of FIG. 1, the heat exchanging elements 40 are shrink fitted, one after the other, into the pipe 32. Thus, the heat exchanging elements 40 and the associated pipe 32 may be constituted by independent components. The lateral play between the heat exchanging elements 40 and the associated pipe 32 prior to the shrink fitting may be approximately 1 mm.

Although the heat exchanging arrangement 12 is connected to one vertically oriented wall section 18 in FIG. 1, the heat exchanging arrangement 12 may alternatively be mounted on either side wall section 18 of the enclosure 16, on both side wall sections 18 of the enclosure 16, and/or on top of the enclosure 16, i.e. on the horizontally oriented wall section 20, or on other types of walls of an enclosure 16.

Figure 2:
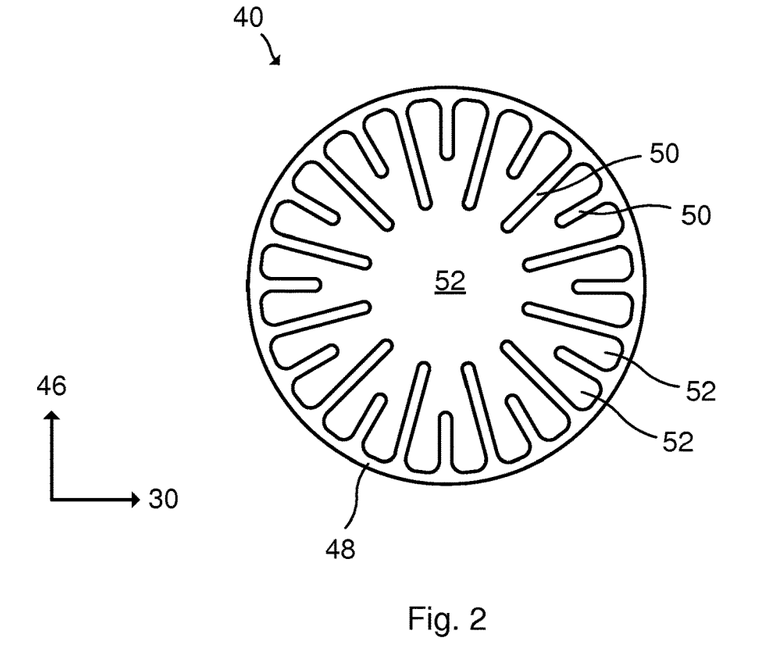
FIG. 2: schematically represents a top view of an example of a heat exchanging element.

FIG. 2 schematically represents a top view of an example of a heat exchanging element 40 in FIG. 1. FIG. 2 also shows second horizontal direction 46 perpendicular to the first horizontal direction 30.

The heat exchanging element 40 of the example in FIG. 2 has a generally cylindrical shape. The heat exchanging element 40 comprises an outer cylinder 48 and a plurality of fins 50 extending laterally inwards towards the center of the heat exchanging element 40. The cylinder 48 and the fins 50 are integrally formed, e.g. of aluminum, by an extrusion process. Thus, the heat exchanging element 40 has a constant cross sectional profile along its extension axis, i.e. the axis that is substantially coincident with the longitudinal axis 36 of the pipe 32 when the heat exchanging element 40 is inserted into the pipe 32.

The fins 50 are of two different lengths towards the center of the heat exchanging element 40. As illustrated in FIG. 2, the fins 50 extend laterally inwards towards the center of the heat exchanging element 40 with an alternating extension. This design of the heat exchanging element 40 provides for an efficient internal passage 52 in terms of heat transfer from dielectric fluid 24 through the heat exchanging element 40.

Although the internal passages 52 between the fins 50 and the central internal passage 52 are continuous in the example of FIG. 2, the internal passages 52 between the fins 50 may be regarded as sub passages. The design of the heat exchanging element 40 in FIG. 2 with fins 50 of alternating length reduces the maximum lateral width between the fins 50. The lateral width between the fins 50 may be 0.2 mm or less. Thereby, the efficiency of heat transfer from the dielectric fluid 24 can be improved since no part, or a reduced part, of the dielectric fluid 24 is not cooled when travelling through the pipe 32.

Figure 3:
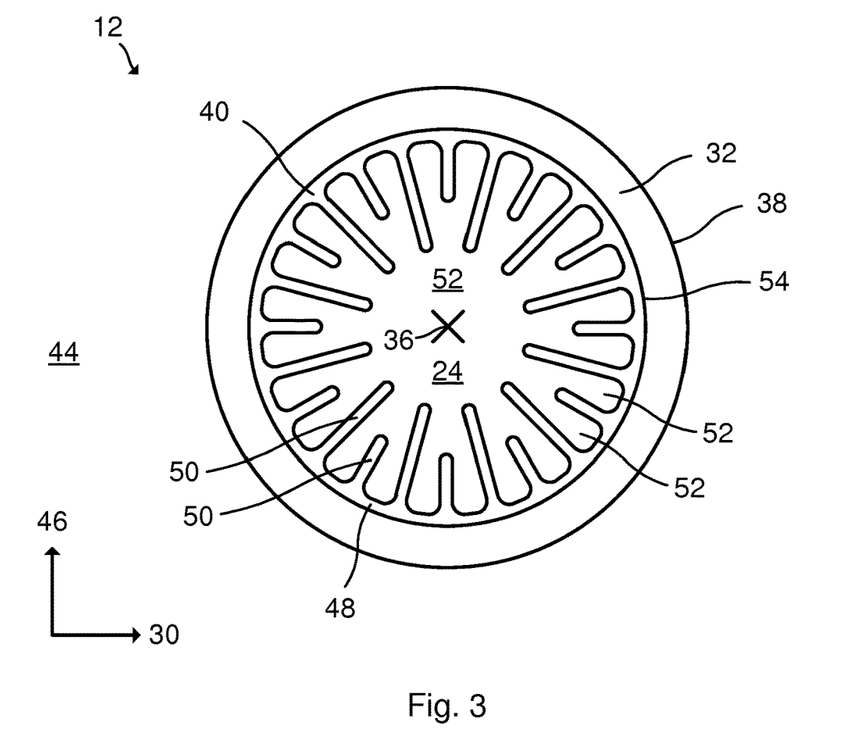
FIG. 3: schematically represents a top view of an example of a heat exchanging arrangement comprising a pipe and the heat exchanging element in FIG. 2.

FIG. 3 schematically represents a top view of an example of a heat exchanging arrangement 12 comprising the pipe 32 in FIG. 1 and the heat exchanging element 40 in FIG. 2. The heat exchanging element 40 and the pipe 32 are shrink fitted. Thereby, the heat exchanging element 40 presses laterally outwards against an internal surface 54 of the pipe 32.

Calculations of the stress distributions in the heat exchanging element 40 and in the pipe 32 in FIG. 3 indicate that the stress is evenly distributed. No critical high spot is indicated when the pressure of the dielectric fluid 24 is under 500 bar hydrostatic pressure.

Figure 4:
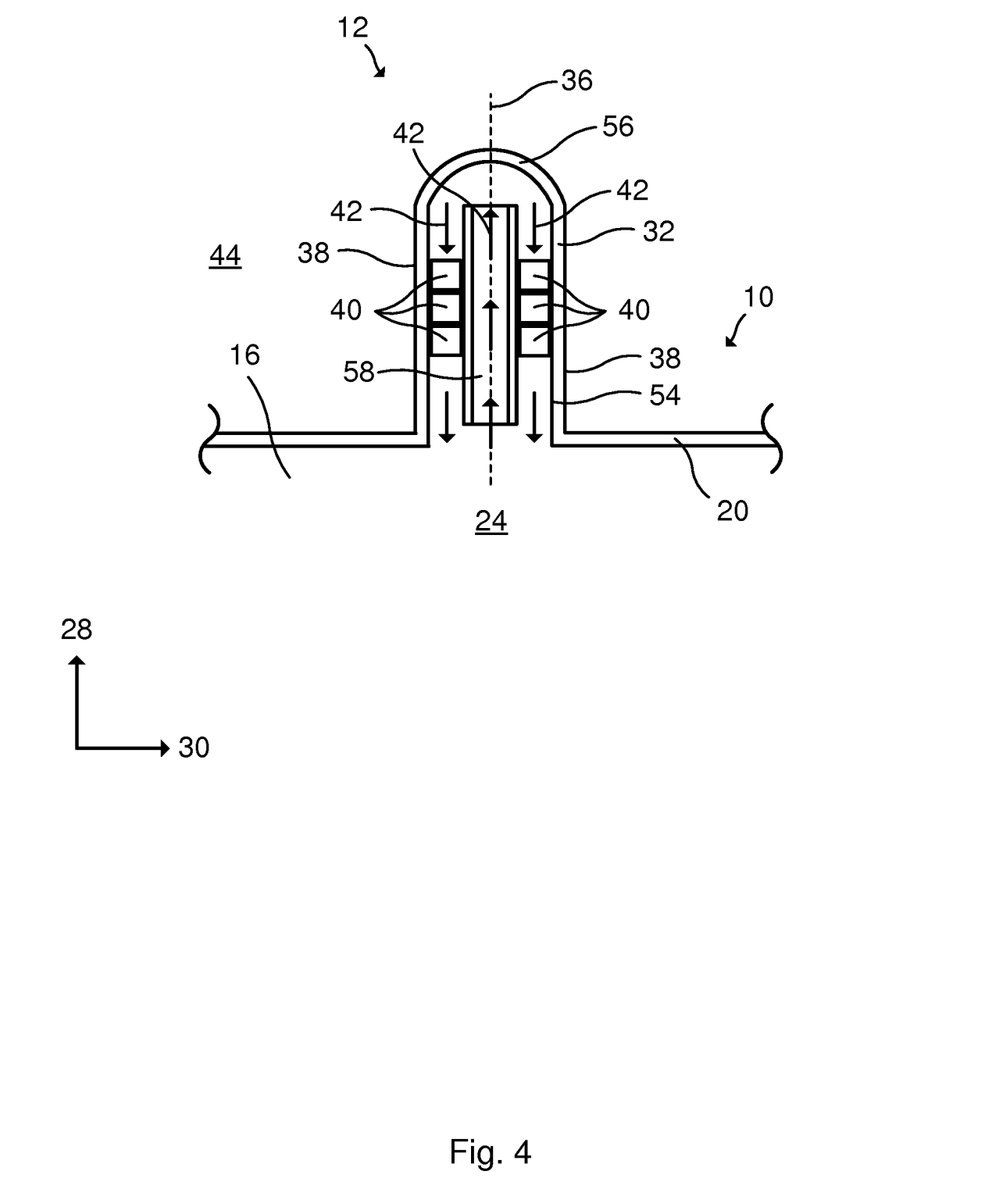
FIG. 4: schematically represents a partial side view of a further example of a subsea electronic system comprising an alternative heat exchanging arrangement.

FIG. 4 schematically represents a partial side view of a further example of a subsea electronic system 10 comprising an alternative heat exchanging arrangement 12. The pipe 32 of this example is welded directly to the enclosure 16. However, the pipe 32 may alternatively be welded to the enclosure 16 via connection pipes 34, as in FIG. 1. The pipe 32 comprises a closed end 56 distal with respect to the enclosure 16. The pipe 32 is oriented substantially perpendicular to the horizontal wall section 20 of the enclosure 16.

The heat exchanging arrangement 12 of the example in FIG. 4 comprises a plurality, here three, heat exchanging elements 40 arranged within the pipe 32. The heat exchanging elements 40 may be of the same type as illustrated in FIGS. 2 and 3.

The heat exchanging elements 40 are shrink fitted within the pipe 32. The heat exchanging arrangement 12 of FIG. 4 further comprises a thermally insulated tube 58. The thermally insulated tube 58 is arranged substantially centrally within the pipe 32 and substantially concentric with the longitudinal axis 36 of the pipe 32, laterally within the heat exchanging elements 40. The thermally insulated tube 58 may be fixed to the heat exchanging elements 40 or to a stationary part of the enclosure 16.

The thermally insulated tube 58 of the example in FIG. 4 has a circular cross sectional profile with an outer diameter corresponding to the lateral position of the longer fins 50 in FIGS. 2 and 3. Thereby, several separate internal passages (not denoted in FIG. 4) are defined within the heat exchanging elements 40, laterally outside of the thermally insulated tube 58.

In operation of the subsea electronic system 10, hot dielectric fluid 24 flows upwards through the thermally insulated tube 58 and to the closed end 56 of the pipe 32. At the closed end 56, the flow of hot dielectric fluid 24 branches and returns to the several internal passages within the heat exchanging elements 40 laterally between the outer surface of the thermally insulated tube 58 and the internal surface 54 of the pipe 32. The dielectric fluid 24 is cooled when flowing back through the heat exchanging elements 40. The thermal insulation of the tube 58 contributes to the circulation of the dielectric fluid 24.

It is also possible to manufacture the heat exchanging elements 40 in pieces at one level within the pipe 32. Inside one pipe 32, a plurality of heat exchanging elements 40 may be provided around the longitudinal axis 36 of the pipe 32, e.g. several heat exchanging elements 40 may each have a general appearance of a circular sector. Alternatively, or in addition, inside one pipe 32, a plurality of heat exchanging elements 40 may be provided along the longitudinal axis 36 of the pipe 32, e.g. several heat exchanging elements 40 may be stacked on each other. Alternatively, the one or more heat exchanging elements 40 may extend through substantially the entire length of the associated pipe 32.

Figure 5:
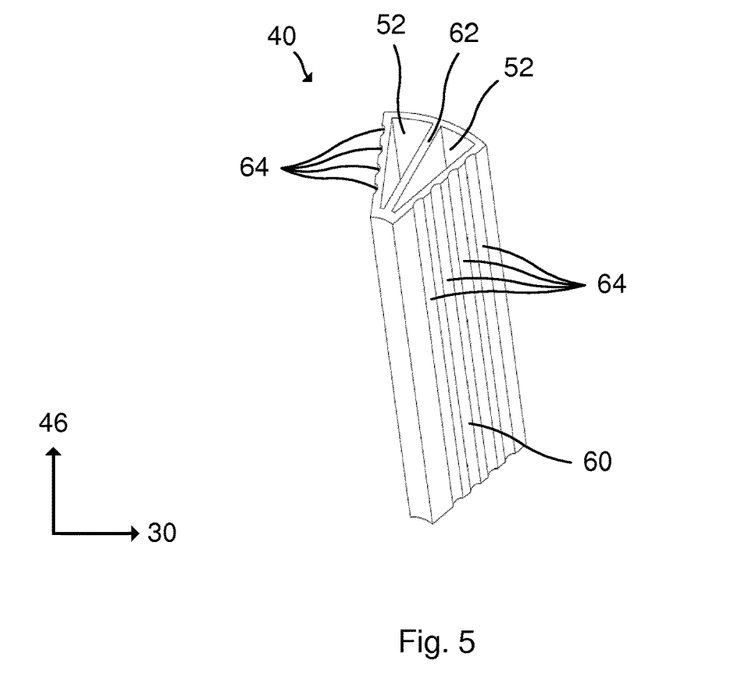
FIG. 5: schematically represents a perspective view of a further example of a heat exchanging element.
Figure 6:
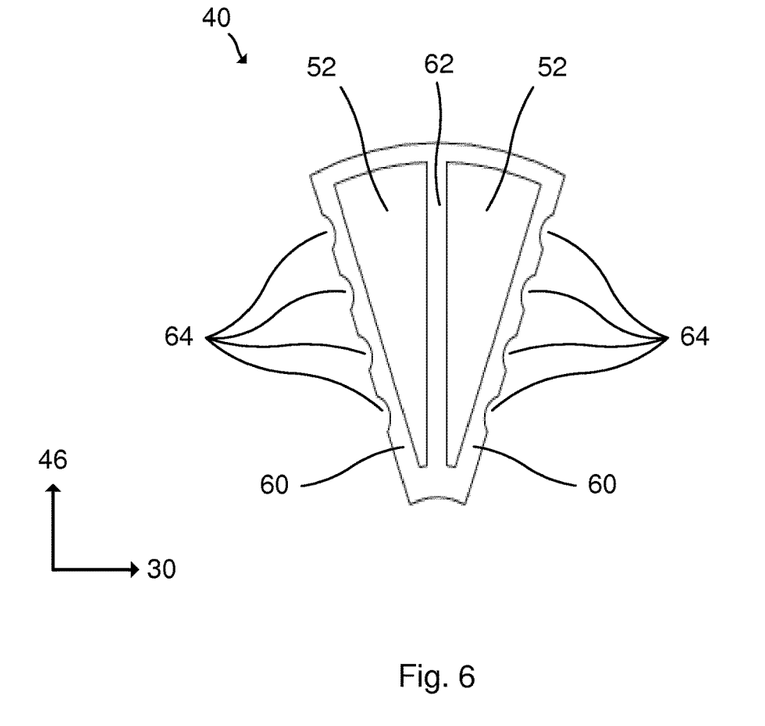
FIG. 6: schematically represents a top view of the heat exchanging element in FIG. 5.

FIG. 5 schematically represents a perspective view of a further example of a heat exchanging element 40 and FIG. 6 schematically represents a top view of the heat exchanging element 40 in FIG. 5. With collective reference to FIGS. 5 and 6, the heat exchanging element 40 has a generally wedge-shaped appearance. The cross section of the heat exchanging element 40 has substantially the shape of a circular sector. Also the heat exchanging element 40 in FIGS. 5 and 6 is formed by aluminum extrusion.

The heat exchanging element 40 comprises two outer lateral walls 60 forming an angle and a center wall 62 therebetween. Each of the lateral walls 60 and the center wall 62 has a general extension plane comprising the longitudinal axis 36 of the pipe 32 when the heat exchanging element 40 is inserted into the pipe 32. One internal passage 52 is formed between the center wall 62 and each outer lateral wall 60. A plurality of longitudinal recesses 64 are formed on the outer side of each outer lateral wall 60. In FIGS. 5 and 6, the heat exchanging element 40 comprises four longitudinal recesses 64 on each lateral wall 60, each having a cross sectional profile of a half circle, but the number and shape of the longitudinal recesses 64 may be varied.

Figure 7:
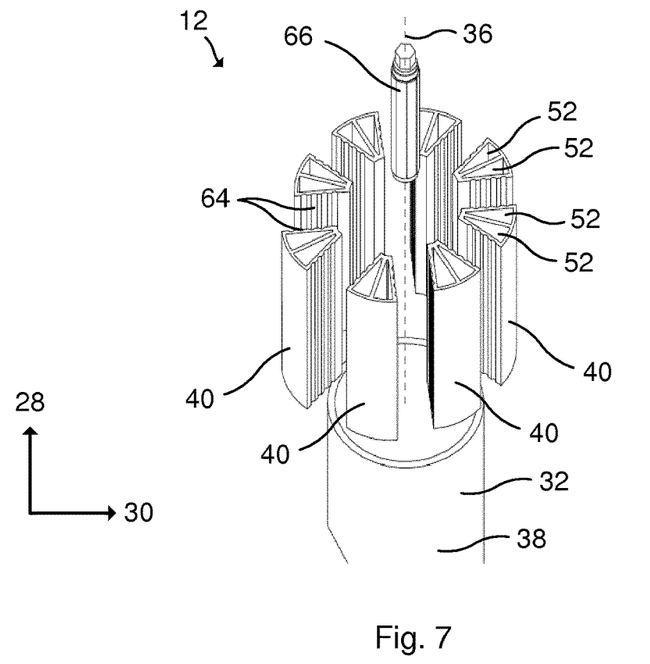
FIG. 7: schematically represents a partial perspective view of a further example of a heat exchanging arrangement in an unassembled state.
Figure 8:
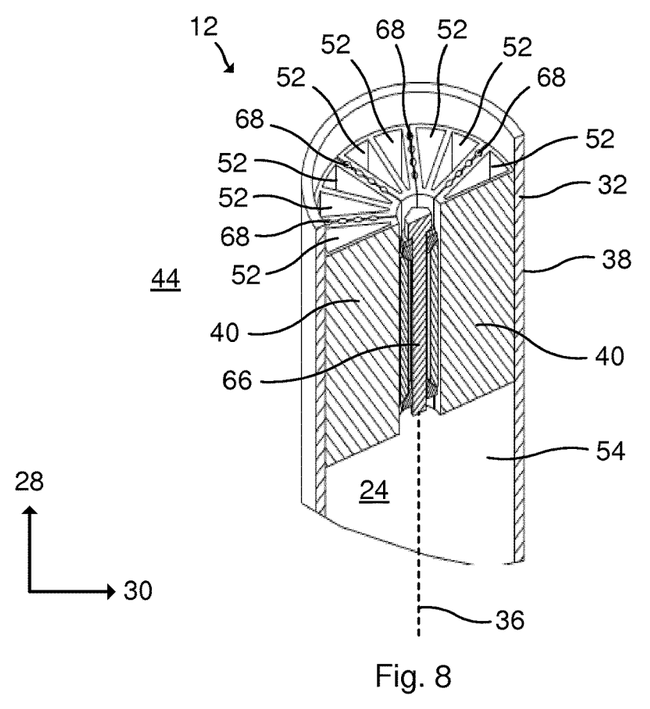
FIG. 8: schematically represents a partial perspective cross sectional view of the heat arrangement in FIG. 7 in an assembled state.

FIG. 7 schematically represents a partial perspective view of a further example of a heat exchanging arrangement 12 in an unassembled state and FIG. 8 schematically represents a partial perspective cross sectional view of the heat exchanging arrangement 12 in FIG. 7 in an assembled state. The heat exchanging arrangement 12 in FIGS. 7 and 8 further comprises an expansion tool 66 for pressing the heat exchanging elements 40 laterally outwards against the internal surface 54 of the associated pipe 32.

With collective reference to FIGS. 7 and 8, the heat exchanging arrangement 12 comprises eight heat exchanging elements 40 at one level (i.e. at one point along the longitudinal axis 36) of the pipe 32. Thus, each heat exchanging element 40 has an angular extension about the longitudinal axis 36 of the pipe 32 of approximately 45°. However, the heat exchanging arrangement 12 may comprise alternative numbers of heat exchanging elements 40 at one level of the pipe 32, including for example only one, two, three, six, eight and twelve.

When the heat exchanging elements 40 are assembled, the longitudinal recesses 64 of two mated heat exchanging elements 40 jointly form further internal passages 68 through which the dielectric fluid 24 can flow, as shown in FIG. 8. These internal passages 68 increase the flow of dielectric fluid 24 through the pipe 32 and increase the surface area for heat transfer from the dielectric fluid 24.

As one example of alternative configuration to the configuration of the heat exchanging elements 40 in FIGS. 7 and 8, the heat exchanging arrangement 12 may comprise two heat exchanging elements 40 formed as halves that are later joined together, e.g. circular sectors each having an angular extension around the longitudinal axis 36 of the pipe 32 of approximately 180°.

Figure 9:
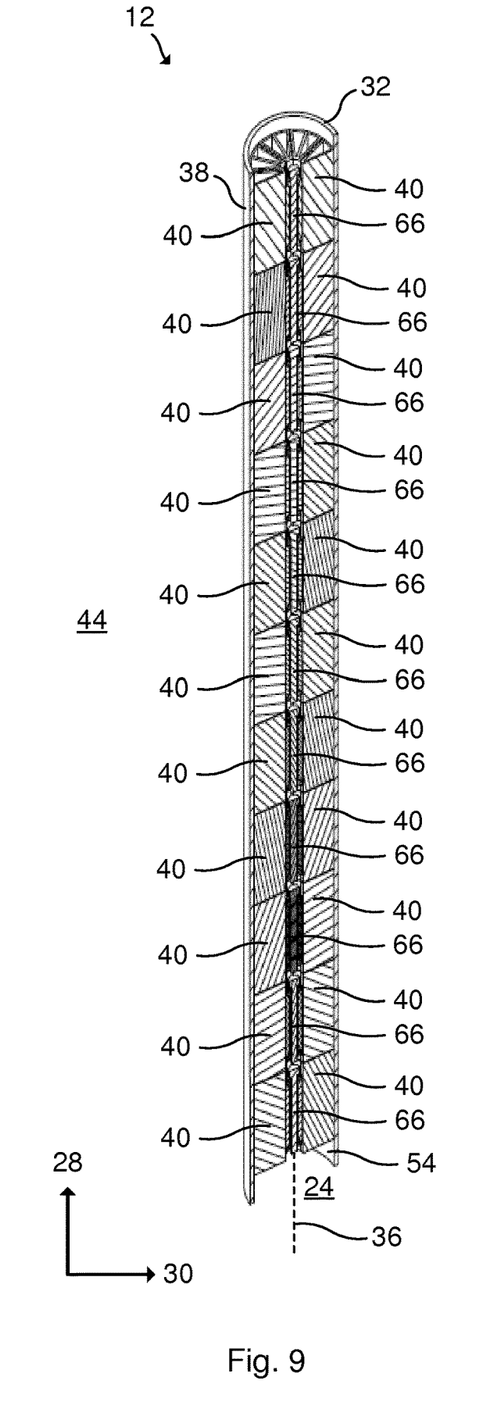
FIG. 9: schematically represents a partial perspective cross sectional view of the heat exchanging arrangement in FIGS. 7 and 8.

FIG. 9 schematically represents a partial perspective cross sectional view of the heat exchanging arrangement 12 in FIGS. 7 and 8. The heat exchanging arrangement 12 in FIG. 9 can be assembled by introducing a first group of heat exchanging elements 40 into the pipe 32, e.g. the lowermost group of eight heat exchanging elements 40 in FIG. 9. A first expansion tool 66 may then be inserted into the center of the pipe 32 between the first group of heat exchanging elements 40. The first expansion tool 66 may then be activated to press the first group of heat exchanging elements 40 laterally outwards against the internal surface 54 of the pipe 32. The first expansion tool 66 may then be left within the pipe 32.

A second group of heat exchanging elements 40 may then be inserted into the pipe 32 and placed on top of the first group of heat exchanging elements 40. The first and second groups of heat exchanging elements 40 may be aligned such that the internal passages 52, 68 can be continuous through the pipe 32. Alternatively, the first and second groups of heat exchanging elements 40 may be rotationally offset, e.g. every second heat exchanging element 40 may be rotated about the longitudinal axis 36 of the pipe 32, such that the internal passages through the pipe 32 are alternatingly constituted by the internal passages 52 and the internal passages 68. In any case, the heat exchanging elements 40 may or may not be placed on top of each other. In other words, a play along the longitudinal axis 36 of the pipe 32 may or may not be provided between adjacent heat exchanging elements 40.

A second expansion tool 66 may then be inserted into the center of the pipe 32 between the second group of heat exchanging elements 40. The second expansion tool 66 may then be activated to press the second group of heat exchanging elements 40 laterally outwards against the internal surface 54 of the pipe 32. Depending on the implementation, further additional groups of heat exchanging elements 40 may then be inserted into the pipe 32 and secured to the pipe 32 in the same manner by means of additional expansion tools 66.

When the desired number of heat exchanging elements 40 have been fitted within the pipe 32, the pipe 32 may be welded directly to the enclosure 16 of the subsea electronic system 10, or to respective connection pipes 34 of the enclosure 16. In the example of FIG. 9, each expansion tool 66 may be approximately 200 mm long (i.e. in the vertical direction 28).

Figure 10:
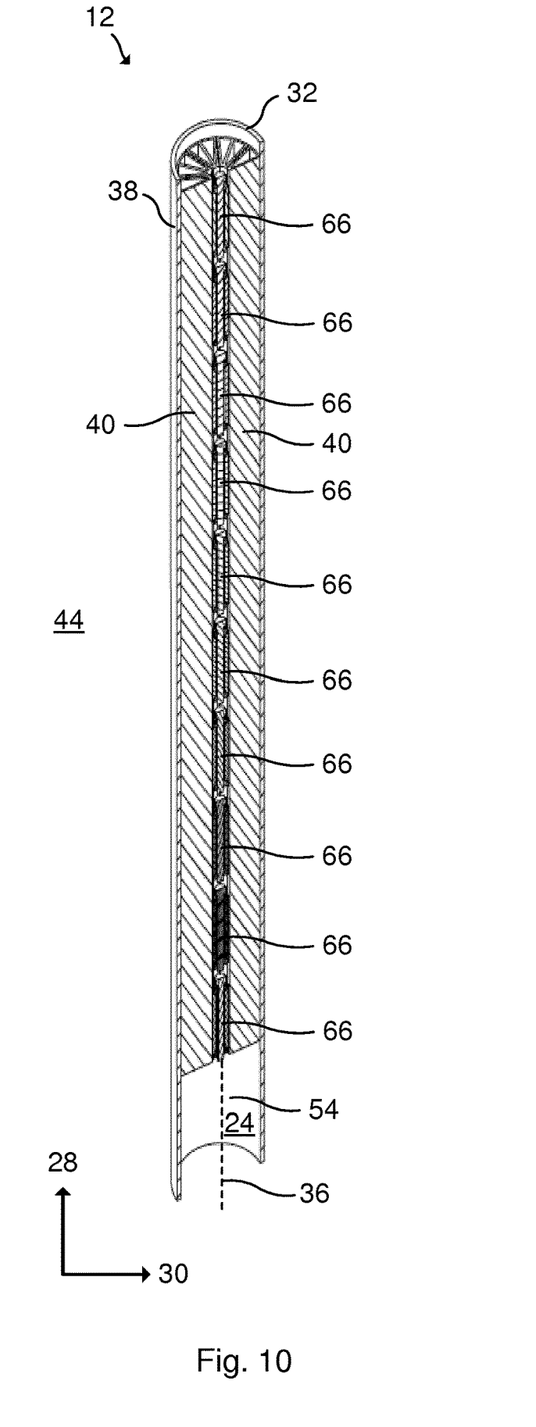
FIG. 10: schematically represents a partial perspective cross sectional view of a further example of a heat exchanging arrangement.

FIG. 10 schematically represents a partial perspective cross sectional view of a further example of a heat exchanging arrangement 12. In contrast to the heat exchanging arrangement 12 in FIG. 9 comprising a plurality of groups of heat exchanging elements 40 stacked on each other, the heat exchanging arrangement 12 in FIG. 10 comprises one group of continuous heat exchanging elements 40. In FIG. 10, the length of each heat exchanging element 40 along the longitudinal axis 36 of the pipe 32 is longer than the maximum lateral distance within the internal surface 54 of the pipe 32 (e.g. the inner diameter of the pipe 32). More specifically, in the example in FIG. 10, the length of each heat exchanging element 40 along the longitudinal axis 36 of the pipe 32 is approximately seven times the inner diameter of the pipe 32. However, this distance may alternatively be for example two, three, four, ten or 20 times the inner diameter of the pipe 32.

The heat exchanging arrangement 12 in FIG. 10 may be assembled by introducing a group (eight in FIG. 10) of heat exchanging elements 40 into the pipe 32. A first expansion tool 66 may then be inserted into the center of the pipe 32 and at a lower region of the pipe 32 between the group of heat exchanging elements 40. The first expansion tool 66 may then be activated to press a first portion (e.g. the lower portion in FIG. 10) of the group of heat exchanging elements 40 laterally outwards against the internal surface 54 of the pipe 32. Depending on the implementation, further additional expansion tools 66 may then be inserted into the pipe 32 between the group of heat exchanging elements 40 and activated to press further portions of the group of heat exchanging elements 40 laterally outwards against the internal surface 54 of the pipe 32.

The expansion tools 66 may be the same for each heat exchanging arrangement 12 in FIGS. 9 and 10. Alternatively, longer expansion tools 66 or one single long expansion tool 66 may be used to press the heat exchanging elements 40 laterally outwards against the internal surface 54 of the pipe 32.

Figure 11:
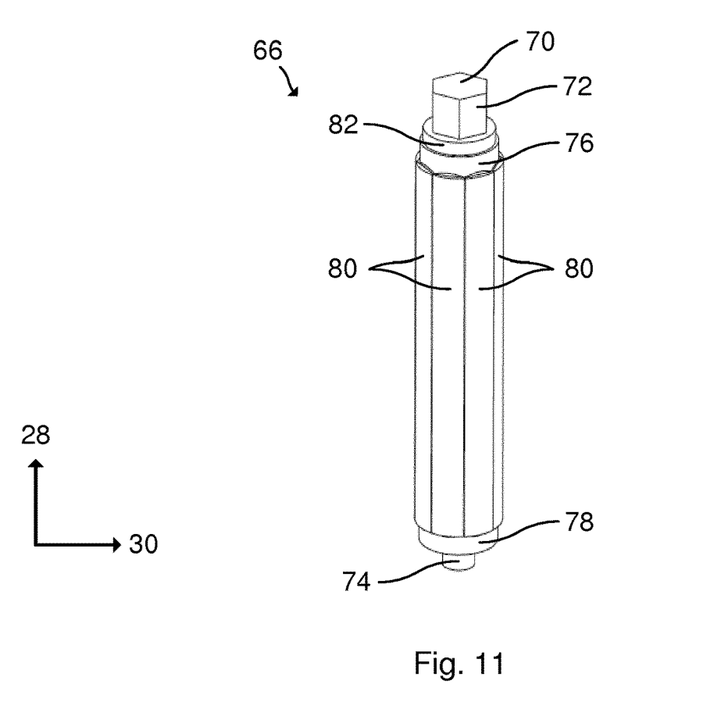
FIG. 11: schematically represents a perspective view of an expansion tool.

FIG. 11 schematically represents a perspective view of the expansion tool 66 shown in FIGS. 7 to 10 and FIG. 12 schematically represents a perspective cross sectional view of the expansion tool 66 in FIG. 11. With collective reference to FIGS. 11 and 12, the expansion tool 66 comprises a bolt 70 having a head 72 and a shaft 74, an upper tapered element 76, a lower tapered element 78 and a plurality of expanding elements 80 arranged around the bolt shaft 74 and having tapered surfaces. The lower tapered element 78 comprises an internal thread to threadingly engage an external thread of the bolt shaft 74.

Figure 12:
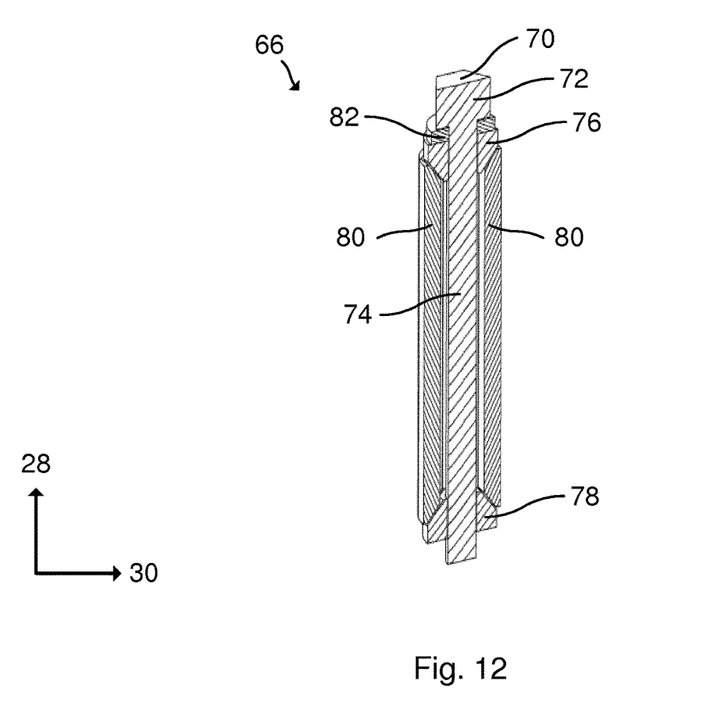
FIG. 12: schematically represents a perspective cross sectional view of the expansion tool in FIG. 11.

By turning the bolt 70, e.g. by engaging the bolt head 72 with a suitable tool, the bolt 70 rotates relative to the lower tapered element 78 and the lower tapered element 78 is brought closer to bolt head 72. At the same time, the upper tapered element 76 is prevented from moving axially upwards by the head 72 of the bolt 70. As the upper tapered element 76 and the lower tapered element 78 move axially closer to each other, the tapered surfaces of the upper tapered element 76 and of the lower tapered element 78 engage with the tapered surfaces of the expanding elements 80. Thereby, the expanding elements 80 are forced laterally outwards to press one or more heat exchanging elements 40 against the internal surface 54 of an associated pipe 32. In other words, the expansion tool 66 is activated. The lateral play between the heat exchanging elements 40 and the associated pipe 32 prior to the activation by one or more expansion tools 66 may be approximately 5 mm.

The expansion tool 66 of FIGS. 11 and 12 further comprises a conical washer 82 around the bolt shaft 74 between the bolt head 72 and the upper tapered element 76. The conical washer 82 contributes to maintain the lateral outward force on the installation after tightening the bolt 70. In this way, it can be ensured that the contact pressure between one or more heat exchanging elements 40 and the internal surface 54 of the associated pipe 32 is constant independent of heat expansion. The expansion tool 66 of FIG. 11 is merely one example of suitable expansion tool for pressing at least one heat exchanging element 40 laterally outwards against the internal surface 54 of the associated pipe 32.

Figure 13:
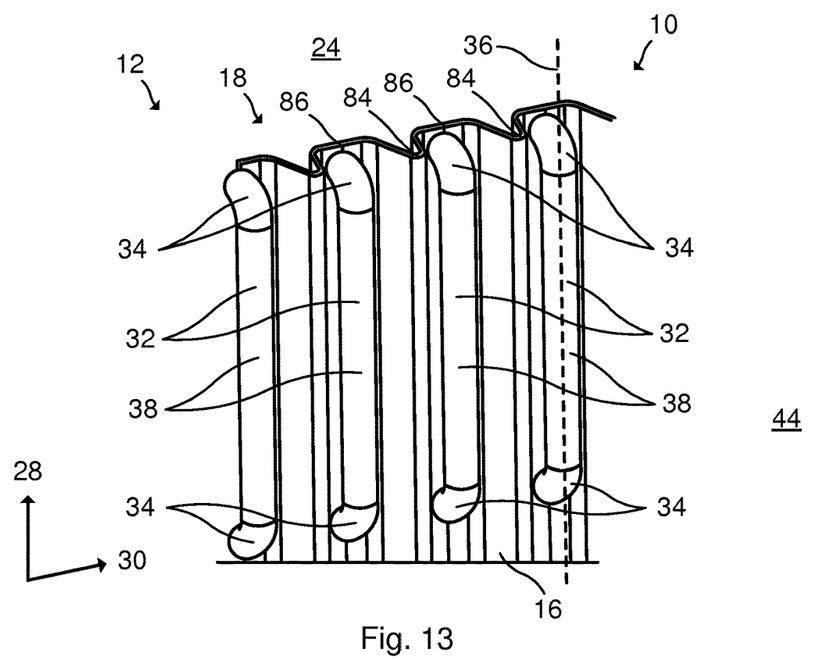
FIG. 13: schematically represents a partial perspective outer view of a further example of a subsea electronic system.
Figure 14:
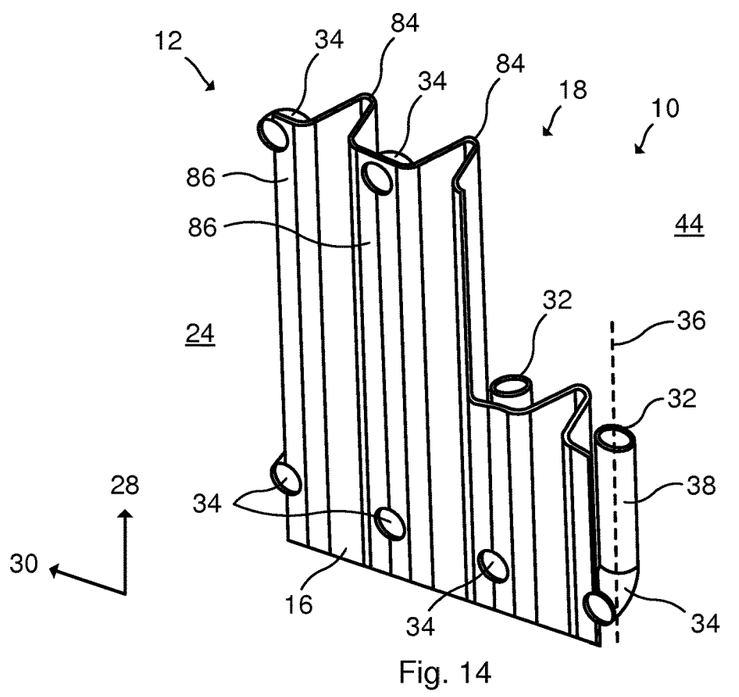
FIG. 14: schematically represents a partial perspective inner view of the subsea electronic system in FIG. 13.

FIG. 13 schematically represents a partial perspective outer view of a further example of a subsea electronic system 10 and FIG. 14 schematically represents a partial perspective inner view of the subsea electronic system 10 in FIG. 13. With collective reference to FIGS. 13 and 14, the vertical wall section 18 of the enclosure 16 has a wave formed profile. The wall section 18 comprises a plurality of peaks 84 and a plurality of valleys 86 in an alternating pattern.

The peaks 84 protrude towards the seawater 44 and the valleys 86 protrude towards the dielectric fluid 24 within the enclosure 16. Each pipe 32 is partly accommodated within a valley 86 of the wall section 18. More specifically, each peak 84 of the wall section 18 is substantially flush with the laterally outer points of the pipes 32. This reduces the footprint of the subsea electronic system 10. Each of the pipes 32 of the subsea electronic system 10 in FIGS. 13 and 14 may house one or more heat exchanging elements 40 as described above. Although four pipes 32 are shown, the subsea electronic system 10 may comprise fewer or more pipes 32 arranged in this manner.

Figure 15:
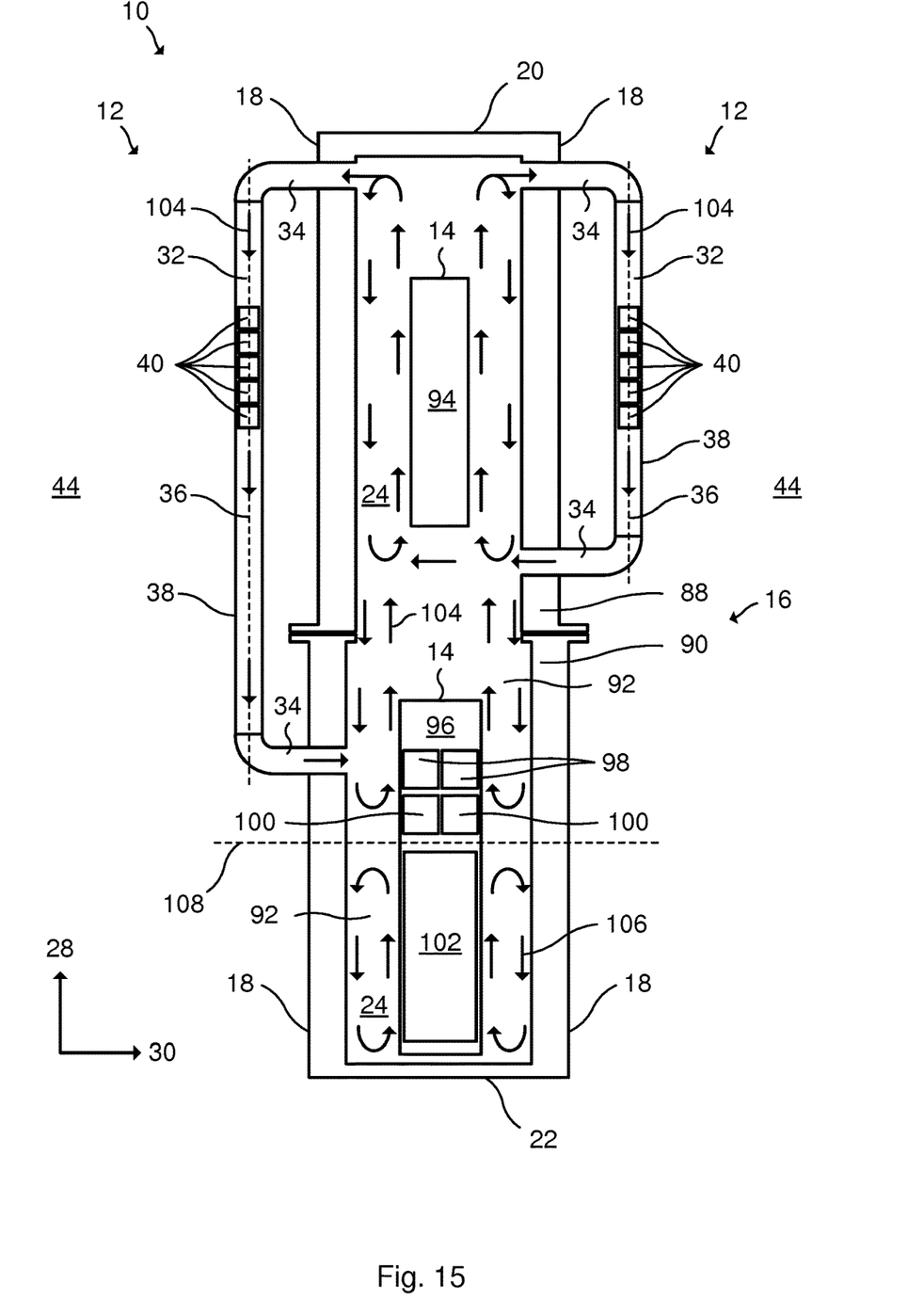
FIG. 15: schematically represents a side view of a further example of a subsea electronic system comprising a heat exchanging arrangement.

FIG. 15 schematically represents a side view of a further example of a subsea electronic system 10 comprising a heat exchanging arrangement 12. The subsea electronic system 10 of this example comprises a watertight enclosure 16 composed of an upper enclosure part 88 and a lower enclosure part 90. The upper enclosure part 88 is arranged on top of the lower enclosure part 90. The upper enclosure part 88 and the lower enclosure part 90 jointly define a continuous enclosure volume 92. Thus, the upper enclosure part 88 is in fluid communication with the lower enclosure part 90. In FIG. 15, the enclosure volume 92 is filled with a dielectric fluid 24. The wave formed profile as illustrated in FIGS. 13 and 14 may be provided on the vertical wall sections 18 of the upper enclosure part 88.

The subsea electronic system 10 in FIG. 15 further comprises an electronic component 14 arranged in the upper enclosure part 88 and an electronic component 14 arranged in the lower enclosure part 90. In the example of FIG. 15, the electronic component 14 in the upper enclosure part 88 is constituted by a power device 94, such as a transformer, and the electronic component 14 in the lower enclosure part 90 is constituted by a power converter 96.

The power converter 96 comprises semiconductor elements 98, 100 and capacitor elements 102. The semiconductor elements 98 may be constituted by diodes and the semiconductor elements 100 may be constituted by insulated-gate bipolar transistors (IGBTs).

The power converter 96 is oriented such that, when the subsea electronic system 10 is installed (for example at a seabed), a majority of the semiconductor elements 98, 100 are positioned in an upper part of the enclosure volume 92 and a majority of the capacitor elements 102 are positioned in a lower part of the enclosure volume 92. An upper cooling circuit 104 is formed in the upper part and a lower cooling circuit 106 is formed in the lower part. The upper cooling circuit 104 and the lower cooling circuit 106 are divided from each other by the imagined horizontal plane 108. The dielectric fluid 24 in the upper cooling circuit 104 and in the lower cooling circuit 106 circulates by natural convection.

The semiconductor elements 98, 100 generate the majority of losses and are relatively insensitive to high temperatures. The capacitor elements 102 generate a minor amount of losses and are relatively sensitive to high temperatures. The power converter 96 is therefore designed in such a way that all constitutive components are in an environment with a temperature that is lower than the limit for reliable long-term operation. Furthermore, the constitutive components are arranged close together to ensure a good performance. In general terms, in use, the upper cooling circuit 104 contains hot dielectric fluid 24 with large flow circulation, whereas the lower cooling circuit 106 is cold with less circulation or nearly stagnant dielectric fluid 24. For this reason, the temperature sensitive components (i.e. the capacitor elements 102) experience a cold environment and the less sensitive components (i.e. the semiconductor elements 98, 100) experience a hot environment.

The heat exchanging arrangement 12 of FIG. 15 comprises a pipe 32 (right pipe in FIG. 15) having several heat exchanging elements 40 arranged inside that is connected only to the upper enclosure part 88 and a pipe 32 (left pipe in FIG. 15) having several heat exchanging elements 40 arranged inside that is connected between the upper enclosure part 88 and the lower enclosure part 90. Both pipes 32 shown in FIG. 15 form a part of the upper cooling circuit 104. In other words, both pipes 32 are arranged above the imagined horizontal plane 108.

Although not shown in FIG. 15, the heat exchanging arrangement 12 may comprise several further pipes 32 arranged in parallel with the illustrated pipes 32 (e.g. "behind" the pipes 32 in the view of FIG. 15). Furthermore, the heat exchanging arrangement 12 may comprise pipes 32 arranged only as the left pipe 32 in FIG. 15 (i.e. connected between the upper enclosure part 88 and the lower enclosure part 90) or only as the right pipe 32 in FIG. 15 (i.e. with both ends connected to the upper enclosure part 88.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A heat exchanging arrangement for a subsea electronic system, the heat exchanging arrangement comprising:
   at least one pipe having an external surface; and
   at least one heat exchanging element arranged inside the at least one pipe and defining at least one internal passage for conducting a dielectric fluid through the at least one pipe;
   wherein the at least one heat exchanging element is arranged to press laterally outwards against an internal surface of the at least one pipe to establish a heat transfer bond between the at least one heat exchanging element and the at least one pipe.

2. The heat exchanging arrangement according to claim 1, wherein the at least one heat exchanging element and the at least one pipe are shrink fitted.

3. The heat exchanging arrangement according to claim 1, further comprising at least one expansion tool substantially concentrically arranged inside the at least one pipe for pressing the at least one heat exchanging element laterally outwards against the internal surface of the at least one pipe.

4. The heat exchanging arrangement according to claim 1, wherein the at least one heat exchanging element includes at least two heat exchanging elements arranged inside the at least one pipe at substantially the same position along a longitudinal axis of the at least one pipe.

5. The heat exchanging arrangement according to claim 1, wherein the at least one heat exchanging element is extruded.

6. The heat exchanging arrangement according to claim 1, wherein the at least one heat exchanging element is made of a material with high thermal conductivity, such as aluminum.

7. The heat exchanging arrangement according to claim 1, wherein the at least one pipe is made of a material resistant to seawater corrosion, such as stainless steel.

8. The heat exchanging arrangement according to claim 1, wherein the at least one heat exchanging element includes at least two heat exchanging elements having longitudinal recesses such that a longitudinal recess of one heat exchanging element and a longitudinal recess of another heat exchanging element together define one of the at least one internal passage when the heat exchanging elements are mated.

9. The heat exchanging arrangement according to claim 1, further comprising a thermally insulated tube arranged laterally inside the at least one heat exchanging element;
   wherein the at least one pipe includes a closed end;
   wherein the thermally insulated tube is arranged to conduct the dielectric fluid towards the closed end of the at least one pipe and wherein the at least one internal passage is arranged to conduct the dielectric fluid away from the closed end of the at least one pipe.

10. A subsea electronic system comprising:
    a watertight enclosure having at least one wall section;
    at least one electronic component arranged inside the enclosure; and
    a heat exchanging arrangement according to claim 1;
    wherein the at least one pipe of the heat exchanging arrangement forms a part of a cooling circuit passing by the at least one electronic component.

11. The subsea electronic system according to claim 10, wherein the at least one wall section has a wave formed profile including peaks and valleys and wherein the at least one pipe is at least partly accommodated within a valley.

12. The subsea electronic system according to claim 10, wherein one of the at least one wall section is a substantially vertically oriented wall section and wherein the heat exchanging arrangement is connected to the wall section.

13. The subsea electronic system according to claim 10, wherein one of the at least one electronic component is constituted by a power converter.

14. The subsea electronic system according to claim 10, wherein the enclosure includes an upper enclosure part and a lower enclosure part jointly defining a continuous enclosure volume for a dielectric fluid; wherein the enclosure volume includes an upper cooling circuit and a lower cooling circuit, vertically below the upper cooling circuit; and wherein the at least one pipe of the heat exchanging arrangement forms a part of the upper cooling circuit passing by the at least one electronic component.

15. The subsea electronic system according to claim 10, wherein, when the at least one electronic component is in use, the dielectric fluid circulates by natural convection.

* * * * *